(12) United States Patent
Tabatabai et al.

(10) Patent No.: US 10,187,029 B1
(45) Date of Patent: Jan. 22, 2019

(54) PHASE SHIFTER

(71) Applicant: Google Inc., Mountain View, CA (US)

(72) Inventors: Farbod Tabatabai, Menlo Park, CA (US); Dedi David Haziza, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 317 days.

(21) Appl. No.: 15/064,976

(22) Filed: Mar. 9, 2016

(51) Int. Cl.
| | | |
|---|---|---|
| *H01Q 3/00* | (2006.01) | |
| *H03H 7/20* | (2006.01) | |
| *H01Q 1/50* | (2006.01) | |
| *H01Q 3/34* | (2006.01) | |
| H01Q 3/36 | (2006.01) | |
| H01Q 25/00 | (2006.01) | |
| H01Q 3/26 | (2006.01) | |

(52) U.S. Cl.
CPC ........... *H03H 7/20* (2013.01); *H01Q 1/50* (2013.01); *H01Q 3/34* (2013.01); *H01Q 3/26* (2013.01); *H01Q 3/36* (2013.01); *H01Q 25/00* (2013.01)

(58) Field of Classification Search
CPC .. H01Q 3/34; H01Q 3/26; H01Q 3/36; H01Q 1/50; H01Q 25/00; H03H 7/20
USPC .................................................. 342/372, 371
See application file for complete search history.

(56) References Cited

U.S. PATENT DOCUMENTS

| | | | |
|---|---|---|---|
| 3,904,996 A | | 9/1975 | Rosenfeld |
| 5,317,276 A * | | 5/1994 | Yamamoto .......... H04L 27/2071 327/231 |
| 7,049,907 B2 * | | 5/2006 | Gurvich ................ H03F 1/3229 333/139 |
| 7,126,442 B2 * | | 10/2006 | Nakajima ................ H03H 7/20 333/156 |
| 7,154,440 B2 * | | 12/2006 | Toncich ..................... H03C 3/20 342/372 |
| 7,446,630 B2 * | | 11/2008 | Chan ........................ H03H 7/18 333/138 |
| 7,633,358 B2 * | | 12/2009 | Nakasha ................ H03H 7/185 333/138 |
| 7,756,491 B2 * | | 7/2010 | Kee ...................... H04B 1/0003 455/114.3 |
| 7,969,359 B2 | | 6/2011 | Krishnaswamy et al. |
| 9,106,180 B2 * | | 8/2015 | Sato ........................ H03B 21/00 |
| 9,831,550 B2 * | | 11/2017 | Kawai ...................... H01Q 3/36 |
| 10,020,792 B2 * | | 7/2018 | Tabatabai ................. H03H 7/20 |
| 2011/0057746 A1 | | 3/2011 | Yamamoto et al. |
| 2015/0070242 A1 * | | 3/2015 | Kawai ..................... H03H 7/20 343/853 |
| 2016/0315595 A1 * | | 10/2016 | Rixain .................... H03H 7/185 |
| 2017/0093363 A1 * | | 3/2017 | Tabatabai ................. H03H 7/20 |
| 2017/0163236 A1 * | | 6/2017 | Rixain .................... H03H 7/185 |
| 2018/0019722 A1 * | | 1/2018 | Birkbeck ................. H03H 7/19 |

* cited by examiner

*Primary Examiner* — Chuong P Nguyen
(74) *Attorney, Agent, or Firm* — Honigman Miller Schwartz and Cohn LLP (57) ABSTRACT

A phase shifter includes an input port, a first coupling line connected to the input port, an output port, and a second coupling line connected to the output port and arranged substantially parallel to the first coupling line. The phase shifter also includes a substrate disposed between the first coupling line and the second coupling line, a first variable capacitor disposed on the first coupling line, and a second variable capacitor disposed on the second coupling line. Adjustment of one or more of the variable capacitors causes a phase shift between the input port and the output port.

25 Claims, 10 Drawing Sheets

PHASE SHIFTER

TECHNICAL FIELD

This disclosure relates to a phase shifter.

BACKGROUND

In general, a phase shifter point changes the phase of the output signal in relation to the input shifter. Phase shifters have numerous uses including, but not limited to, phase discriminators, beam forming networks, power dividers, linearization of power amplifiers, phased array antennas, and electronically steered antennas. As one example application, phased array antennas combine multiple individual transmit/receive (T/R) modules and antennas to create a larger effective aperture. The electronically controlled phase and gain relationship between the individual T/R modules controls the radiation pattern and therefore directivity of the synthesized aperture. The phase is controlled by a phase shifter. This control over the radiation pattern can be used for beam steering in air and space-borne communication systems, for target acquisition and tracking, or for the synthesis of deep nulls for clutter suppression in radar systems.

SUMMARY

One aspect of the disclosure provides a low loss and high resolution phase shifter having broad-line couplers. The phase shifter includes an input port, a first coupling line connected to the input port, an output port, a second coupling line, a substrate, a first variable capacitor, and a second variable capacitor. The second coupling line is connected to the output port and arranged substantially parallel to the first coupling line. The substrate is disposed between the first coupling line and the second coupling line. The first variable capacitor is disposed on the first coupling line, and the second variable capacitor is disposed on the second coupling line. The adjustment of one or more of the variable capacitors causes a phase shift between the input port and the output port.

Implementations of the disclosure may include one or more of the following optional features. In some implementations, the phase shifter includes a first inductor disposed on the first coupling line in parallel with the first variable capacitor and a second inductor disposed on the second coupling line in parallel with the second variable capacitor. Each variable capacitor may be shunt with the corresponding inductor on the respective coupling line. In some examples, each variable capacitor is independently adjustable in response to a change in a signal entering the input port. The first coupling line and the second coupling line may be edge coupled or broadside coupled.

In some examples, the phase shifter includes a third coupling line connected to the second coupling line and arranged substantially parallel to the first coupling line and the second coupling line, and a third variable capacitor disposed on the third coupling line. The phase shifter may also include a third coupling line connected to the second coupling line and arranged substantially parallel to the first coupling line and the second coupling line, and a third variable capacitor disposed on the third coupling line.

Another aspect of the disclosure provides a system for operating a low loss and high resolution phase shifter having broad-line couplers. The system includes an antenna configured to emit a signal and a phase shifter connected to the antenna. The phase shifter includes an input port configured to receive the signal, a first coupling line connected to the input port, an output port in communication with the antenna, a second coupling line, a substrate, a first variable capacitor, and a second variable capacitor. The second coupling line is connected to the output port and is arranged substantially parallel to the first coupling line. The substrate is disposed between the first coupling line and the second coupling line. The first variable capacitor is disposed on the first coupling line; and the second variable capacitor is disposed on the second coupling line. Adjustment of one or more of the variable capacitors may cause a phase shift between the input port and the output port.

This aspect may include one or more of the following optional features. The system may include a transceiver connected to the antenna and configured to transmit or receive the signal, wherein the transceiver includes the phase shifter. The phase shifter may also include a first inductor disposed on the first coupling line in parallel with the first variable capacitor, and a second inductor disposed on the second coupling line in parallel with the second variable capacitor. Each variable capacitor may be shunt with the corresponding inductor on the respective coupling line. Each variable capacitor may be independently adjustable in response to a change in the signal entering the input port. The first coupling line and the second coupling line may be edge coupled or broadside coupled.

In some implementations, the phase shifter includes a third coupling line connected to the first coupling line and arranged substantially parallel to the first coupling line and the second coupling line and a third variable capacitor disposed on the third coupling line. The phase shifter may further include a third inductor disposed on the third coupling line in parallel with the third variable capacitor, wherein the third variable capacitor is shunt with the third inductor on the respective coupling line. The adjustment of one or more of the variable capacitors may cause the phase shifter to be approximately between zero and 360 degrees between the input port and the output port.

Yet another aspect of the disclosure provides a method for a low loss and high resolution phase shifter having broad-line couplers. The method includes receiving a signal having a first phase at a phase shifter, adjusting at least one of the variable capacitors, and outputting the signal at the output port of the phase shifter. The outputted signal has a second phase different than the first phase. The phase shifter includes an input port configured to receive the signal, a first coupling line connected to the input port, an output port, a second coupling line connected to the output port and arranged substantially parallel to the first coupling line, a substrate disposed between the first coupling line and the second coupling line, a first variable capacitor disposed on the first coupling line, and a second variable capacitor disposed on the second coupling line. Adjustment of one or more of the variable capacitors causes a phase shift between the input port and the output port.

This aspect may include one or more of the following optional features. The phase shifter may include a first inductor disposed on the first coupling line in parallel with the first variable capacitor and a second inductor disposed on the second coupling line in parallel with the second variable capacitor. Each variable capacitor may be shunt with the corresponding inductor on the respective coupling line. In some examples, the method includes independently adjusting the variable capacitors. The first coupling line and the second coupling line are edge coupled or broadside coupled.

In some examples, the phase shifter includes a third coupling line connected to the first coupling line and arranged substantially parallel to the first coupling line and the second coupling line and a third variable capacitor disposed on the third coupling line. The phase shifter may also include a third inductor disposed on the third coupling line in parallel with the third variable capacitor, wherein the third variable capacitor is shunt with the third inductor on the respective coupling line. The first variable capacitor, the second variable capacitor, and the third variable capacitor may be configured to provide a high resolution phase change. The method may also include outputting the signal from the output port of the phase shifter to an antenna.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

In many signal transmission applications, various signals (e.g., communication signals) need to be adjusted by adjusting a phase of the signal or the wave. For example, in radio transmission systems, an array of antennas can be used to increase the ability to communicate at greater range and/or increase antenna gain in a direction over individual elements. In a phased array antenna, the phase of individual elements may be adjusted to shape the area of coverage, resulting in longer transmissions or steering the transmission direction without physically moving the array. The shape of the coverage may be adjusted by altering the transmission phase and gain of each individual element in the array of the phased array antenna.

Figure 1A:
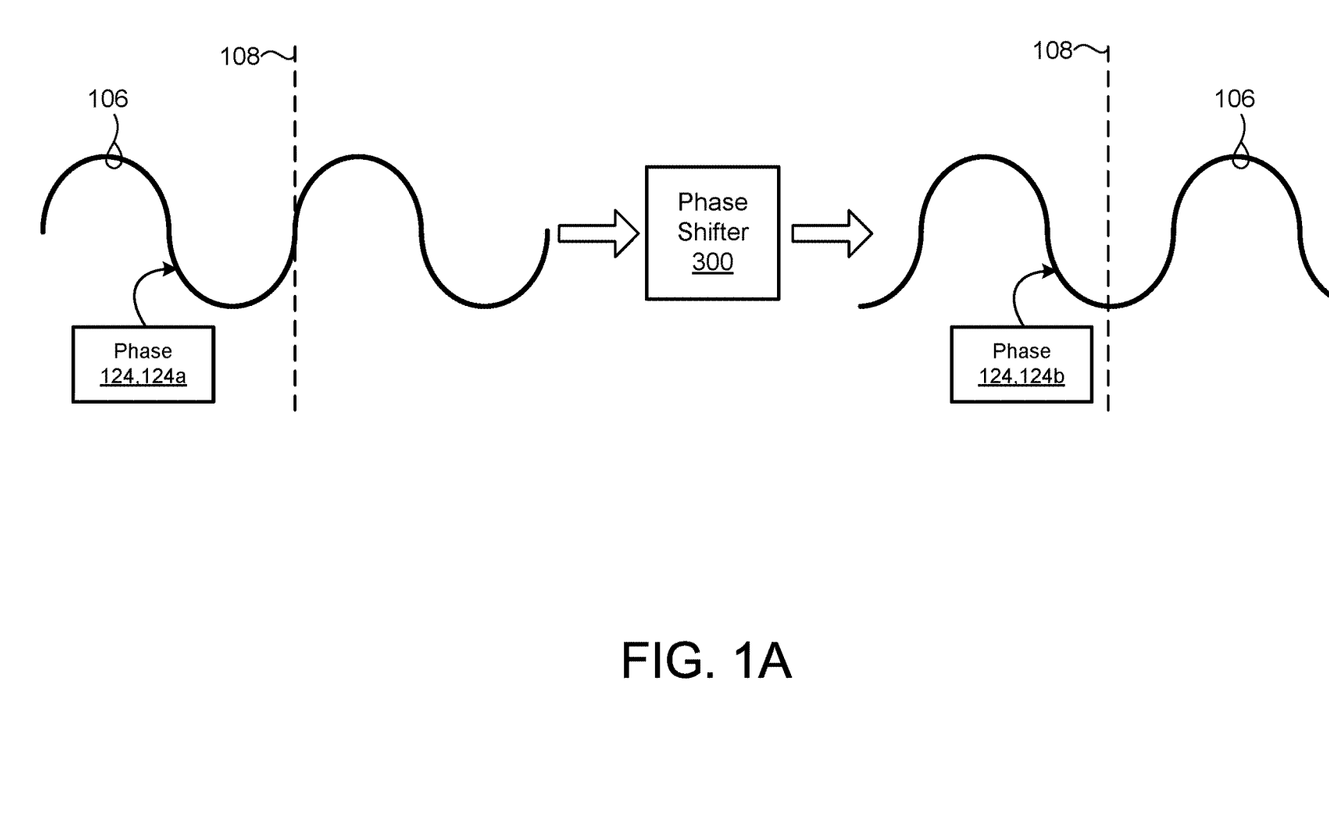
FIG. 1A provides a schematic view of an example signal being phase shifted by a phase shifter.

FIG. 1A provides a schematic view of an example signal 106 (e.g., a cyclical signal) being phase shifted by a broad-line coupler phase shifter 300, also referred to as phase shifter 300. The signal 106, having a first phase 124, 124a, enters the phase shifter 300. The phase 124 of the signal 106 is measured by referencing a reference line 108. The phase of the cyclical signal 106 is how much of the signal 106 has passed a given reference before repeating. The phase shifter 300 shifts/modifies the amount of the signal 106 that has passed the reference line 108. In this example, the phase shifter 300 shifts the first phase 124a of the signal to a second phase 124b of the signal by 45 degrees; however, other values are possible as well.

Figure 1B:
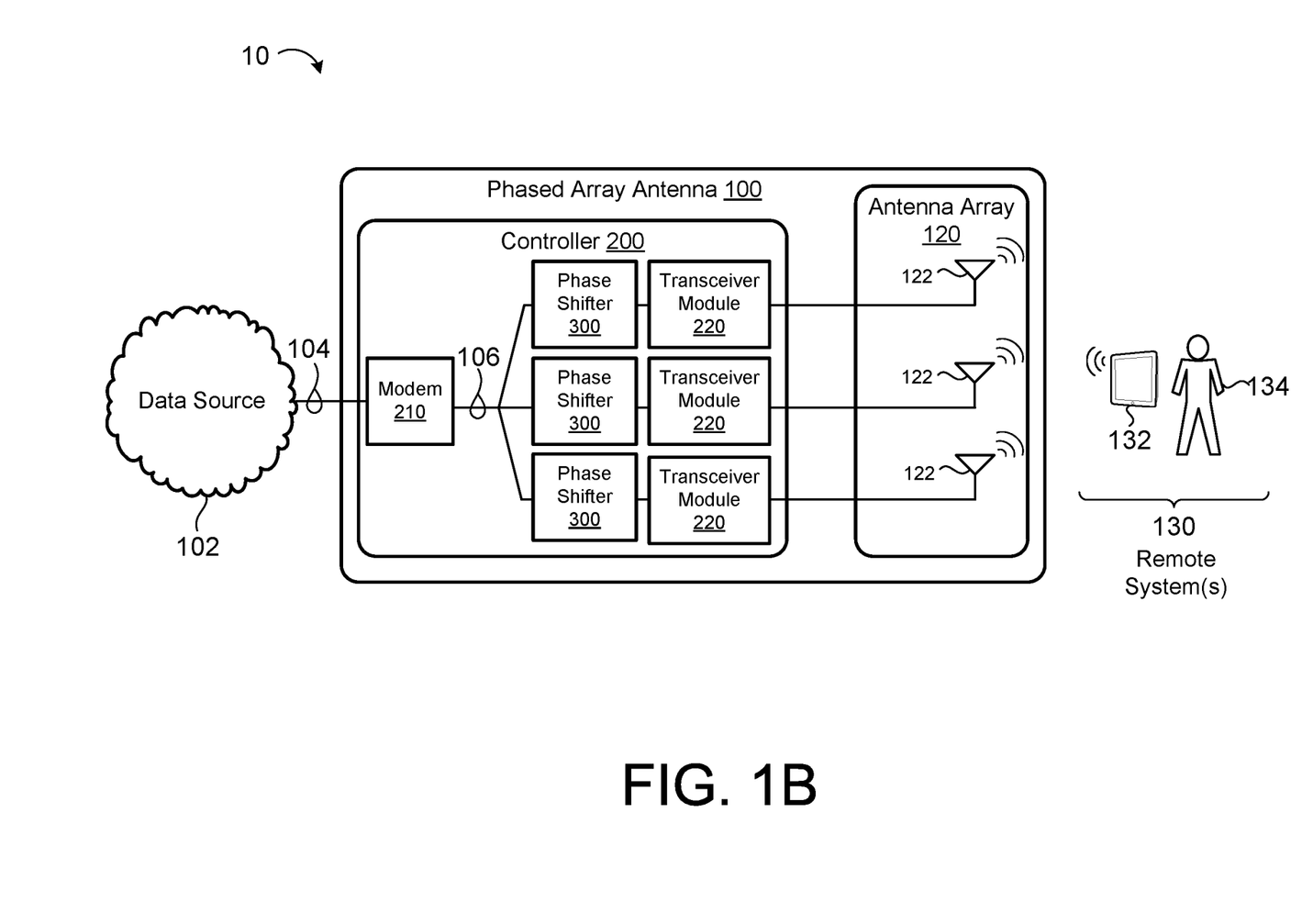
FIG. 1B provides a schematic view of an example phased array antenna system including a phase shifter.

FIG. 1B provides a schematic view of an example phased array antenna system 10 that includes the broad-line phase shifter 300. The phased array antenna system 10 includes a phased array antenna 100 in communication with a data source 102 and a remote system 130. In the example shown, the phased array antenna 100 includes a controller 200 in communication with an antenna array 120. The antenna array 120 includes a plurality of antennas 122. In addition, the controller 200 includes a modem 210 in communication with a plurality of the phased shifters 300. The phase shifters 300 are in communication with a plurality of transceiver modules 220. The modem 210 receives data 104 from the data source 102 and converts the data 104 into a form suitable to be transmitted to the antenna array 120. For example, the modem 210 converts the data 104 to a signal 106 for transmission to or receipt by the transceiver module 220 via electromagnetic energy or radio signals. The phase shifters 300 adjust the signal 106 to steer or focus the electromagnetic energy emitted by the antenna array 120. The antenna array 120 may transmit the electromagnetic energy over the air for receipt by the remote systems 130. The remote systems 130 may include a transceiver device 132 associated with a user 134. The phased array antenna system 10 may also operate in the reverse order, with the remote system 130 transmitting electromagnetic energy to the antenna array 120, which the controller 200 converts to data 104. In some implementations, the phase shifter 300 and modem 210 are located separately from the controller 200 or in a second controller 200 (not shown).

Figure 1C:
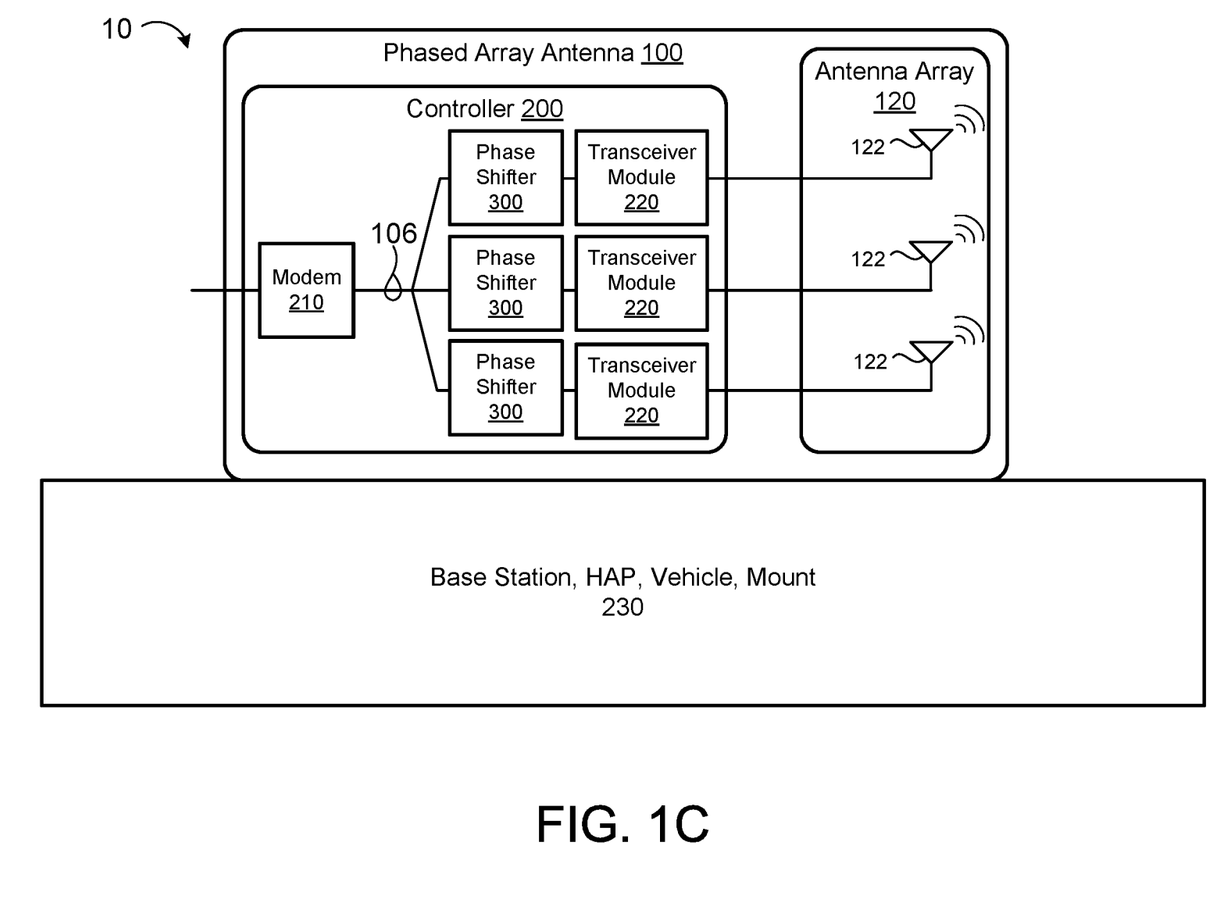
FIG. 1C provides a schematic view of an example phased array antenna system with a phase shifter mounted on a base station, high altitude platform (HAP), vehicle or mount.

FIG. 1C provides a schematic view of an example phased array antenna system 10 with the broad-line phase shifter 300 mounted on a base station, HAP, vehicle or mount 230. In some examples, the HAP 230 is an unmanned aerial system (UAS). The two terms are used interchangeably throughout this application. In the example shown, the HAP 230 includes a body that supports a phased array antenna system 10, which can communicate with a remote system 130, or other HAPs 230 through a communication (e.g., radio signals or electromagnetic energy). The HAP 230 may communicate various data and information to the remote system 130 such as, but not limited to, airspeed, heading, attitude position, temperature, GPS (global positioning system) coordinates, wind conditions, flight plan information, fuel quantity, battery quantity, data received from other sources, data received from other antennas, sensor data, etc. The remote system 130 may communicate to the HAP 230 various data and information, such as, but not limited to, flight directions, flight condition warnings, control inputs, requests for information, requests for sensor data, data to be retransmitted via other antennas or systems, etc. The HAP 230 may be various implementations of flying craft including a combination of the following such as, but not limited to an airplane, airship, helicopter, gyrocopter, blimp, multicopter, glider, balloon, fixed wing, rotary wing, rotor aircraft, lifting body, heavier than air craft, lighter than air craft, etc. The phased array antenna system 10 may be mounted on other objects as well for communication purposes. The other objects include, but are not limited to, an aerial platform (e.g., drone), a terrestrial platform (e.g., car, truck, train, etc.), an aquatic platform (e.g., boat), or a satellite.

One of the challenges associated with establishing a communication system between a HAP 230 and remote system 130 (FIG. 1B) is the movement of the HAP 230. One solution to this problem is the use of an omnidirectional antenna system on the HAP 230 and remote system 130. An omnidirectional antenna is a wireless transmitting or receiving antenna that radiates or intercepts radio-frequency (RF) electromagnetic fields equally in all horizontal directions in a flat two dimensional geometric plane. This presents disadvantages as an omnidirectional antenna has a lower gain and therefore range in exchange for its ability to receive from all directions. A directional antenna, which is a RF wireless antenna designed to function more effectively in some directions than others, may be used to improve the gain and range of the system, but this presents its own challenges as depending on how directional the antenna is, the HAP 230 may move out of the antennas transmission or reception area. When using a directional antenna, a system needs to move both of the antennas (i.e., the HAP antenna and the remote system antenna) to keep both the antennas aligned between the HAP 230 and the remote system 130. This becomes more challenging with greater directionality of the antenna. Additionally, various conditions may cause the HAP 230 to unintentionally move location, such as, but not limited to, wind, thermals, other craft, turbulence, etc., making the system moving the antenna forced to rapidly correct if continuous communication is required. A highly directional antenna may create a narrow cone transmission shape requiring the antenna to be moved on two axes to maintain alignment. A phased antenna array 100 with a fast response phase shifter 300 may be rapidly steered while still providing good directional antenna strength. Moreover, it is desirable that the phase shifter 300 be a high-resolution phase shifter 300 and provides very low signal loss and fine-tuned phase shifting. The phase shifter 300 is based on low loss coupled lines (discussed below with reference to FIGS. 3A-3C).

Figure 2A:
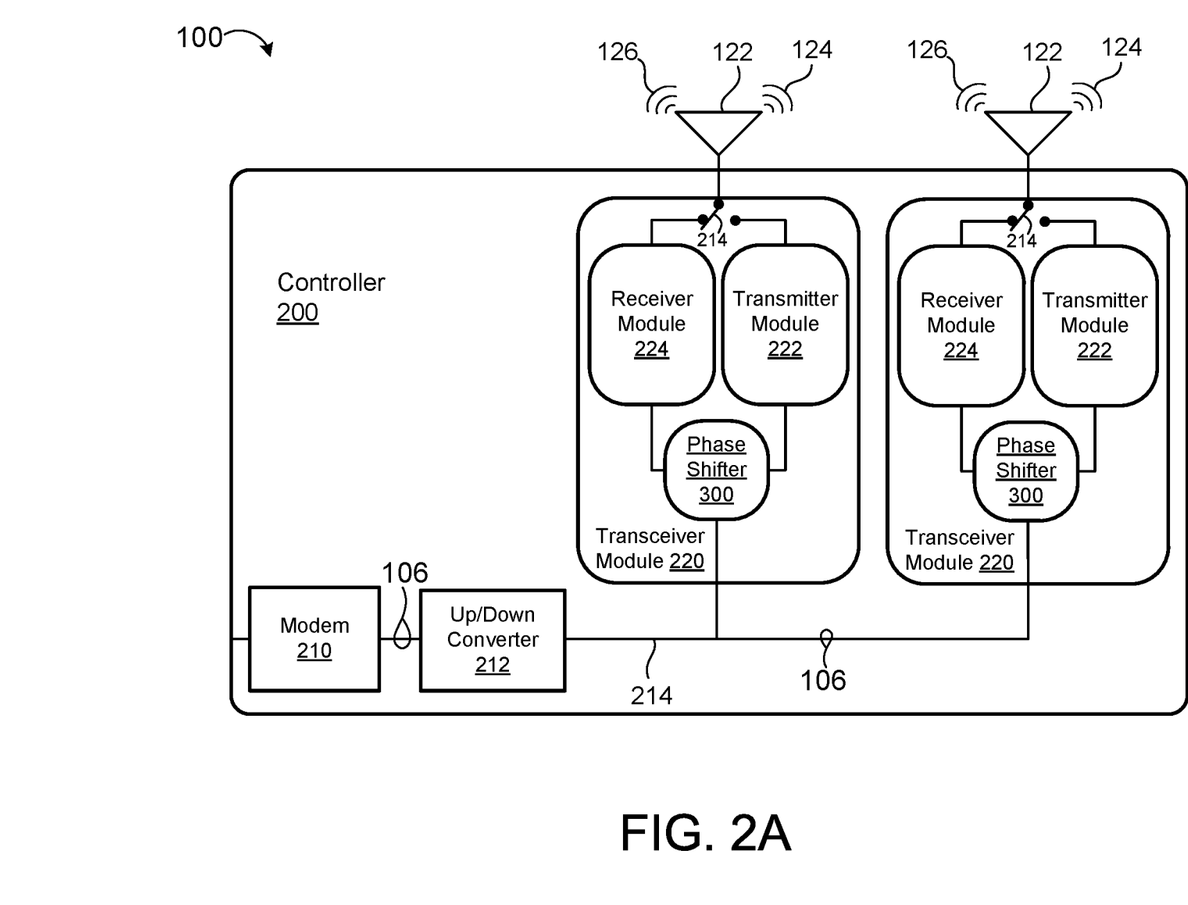
FIG. 2A provides a schematic view of an example phased array antenna including a controller, which includes a modem to receive data and a phase shifter.

FIG. 2A provides a schematic view of an example phased array antenna 100 including a controller 200. The controller 200 includes a modem 210 that receives data 104 (from data sources 102) and a phase shifter 300. In some examples, the modem 210 transfers the data 104 to an up/down converter 212 in communication with the modem 210. The up/down converter 212 converts the signal 106 received by the modem 210 that is in a digitized real signal centered at an intermediate frequency to a baseband complex signal centered at zero frequency (for the digital down converter going from the modem 210 to the converter 212) or the reverse (for the digital up converter going from the converter 212 to the modem 210). Upon this conversion, the up/down converter 212 sends the signal 106 (i.e., the converted signal) via a corporate feed 214 to at least one or more transceiver modules 220, which send or receive the signal 106 via the corresponding antenna 122. The phased array antenna 100 includes the combination of the plurality of the antenna 122 and the transceiver modules 220. The transceiver module 220 is a transmit/receive module and includes a transmitter module 222 and receiver module 224. When the transceiver module 220 is receiving a signal from the antenna 122, then the received signal is received at the receiver module 224. However, when the transceiver 220 is transmitting a signal to the antenna 122, then the transmitter module 222 transmits the signal. As shown, the transceiver 220 includes a switch that diverts the signal to the receiver module 224 when receiving a signal from the antenna 122, and diverts a signal to the antenna when the transmitter module 222 is transmitting the signal. The phase shifter 300 is connected to both the transmitter module 220 and the receiver module 224. The phase shifter 300 is independently controllable and allows for the adjustment of the shape and direction of the electromagnetic energy emitted by the antenna 122. The antenna 122 transmits electromagnetic energy with a phase 124 and a gain 126. The gain 126 is representative of the power or peak height of the electromagnetic wave. The phase 124 is representative of the fraction of the electromagnetic signal wave in relation to an arbitrary origin point.

Figure 2B:
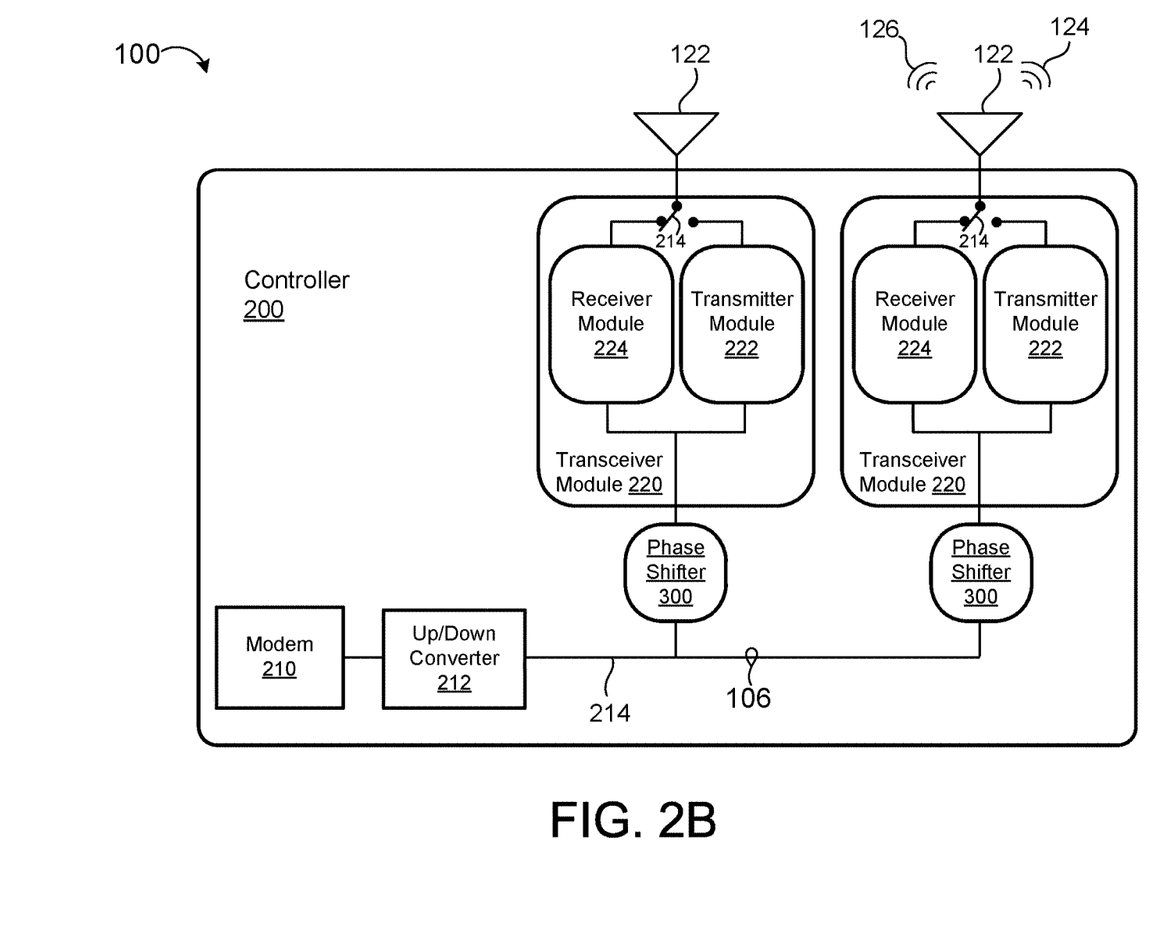
FIG. 2B provides a schematic view of an example phased array antenna where the phase shifter is located outside the transceiver.

FIG. 2B provides a schematic view of an example phased array antenna 100 where the phase shifter 300 is located outside the transceiver 220. In some examples, the phase shifter 300 is connected to each respective transceiver 220 and receives a signal 106 from the corporal feed 214. The phase shifter 300 delivers the phase shifted signal 106 to the transceiver 220 for transmission to the antenna 122. In the reverse, the antenna 122 receives a signal 106, and sends the signal 106 to the transceiver 220. The transceiver 220 sends the signal 106 to the phase shifter 300 for phase shifting. The phase shifter sends the signal 106 to the corporal feed 214.

Figure 2C:
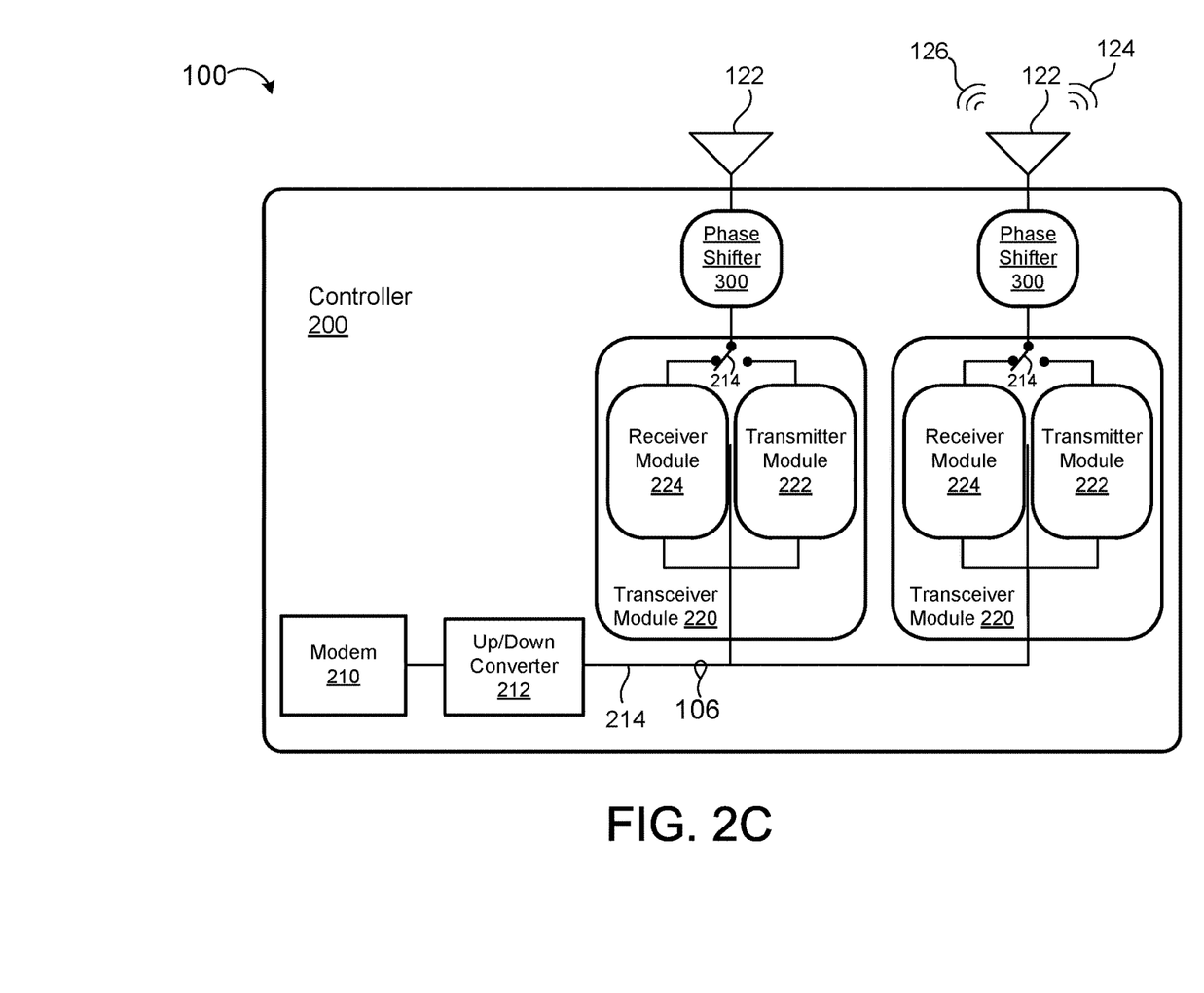
FIG. 2C provides a schematic view of an example phased array antenna where the phase shifter is located outside the transceiver.

FIG. 2C provides a schematic view of an example phased array antenna 100 where the phase shifter 300 is located between the transceiver 220 and the antenna 122. In some examples, the phase shifter 300 is connected to each respective transceiver 220 and receives a signal 106 from the antenna 122. The phase shifter 300 receives the signal from the antenna 122 and delivers the phase shifted signal 106 to the transceiver 220. In the reverse, the transceiver 220 receives a signal 106 from the corporal feed 214, and sends the signal 106 to the phase shifter 300, which in turn sends the shifted signal to the antenna 122. In some examples, the phase shifter 300 shifts the signal 106 from the transmitter 220 before beam-forming at the antenna 122. In other examples, the phase shifter 300 shifts the signal 106 at each individual element in the array of the phased array antenna 122.

Figure 3A:
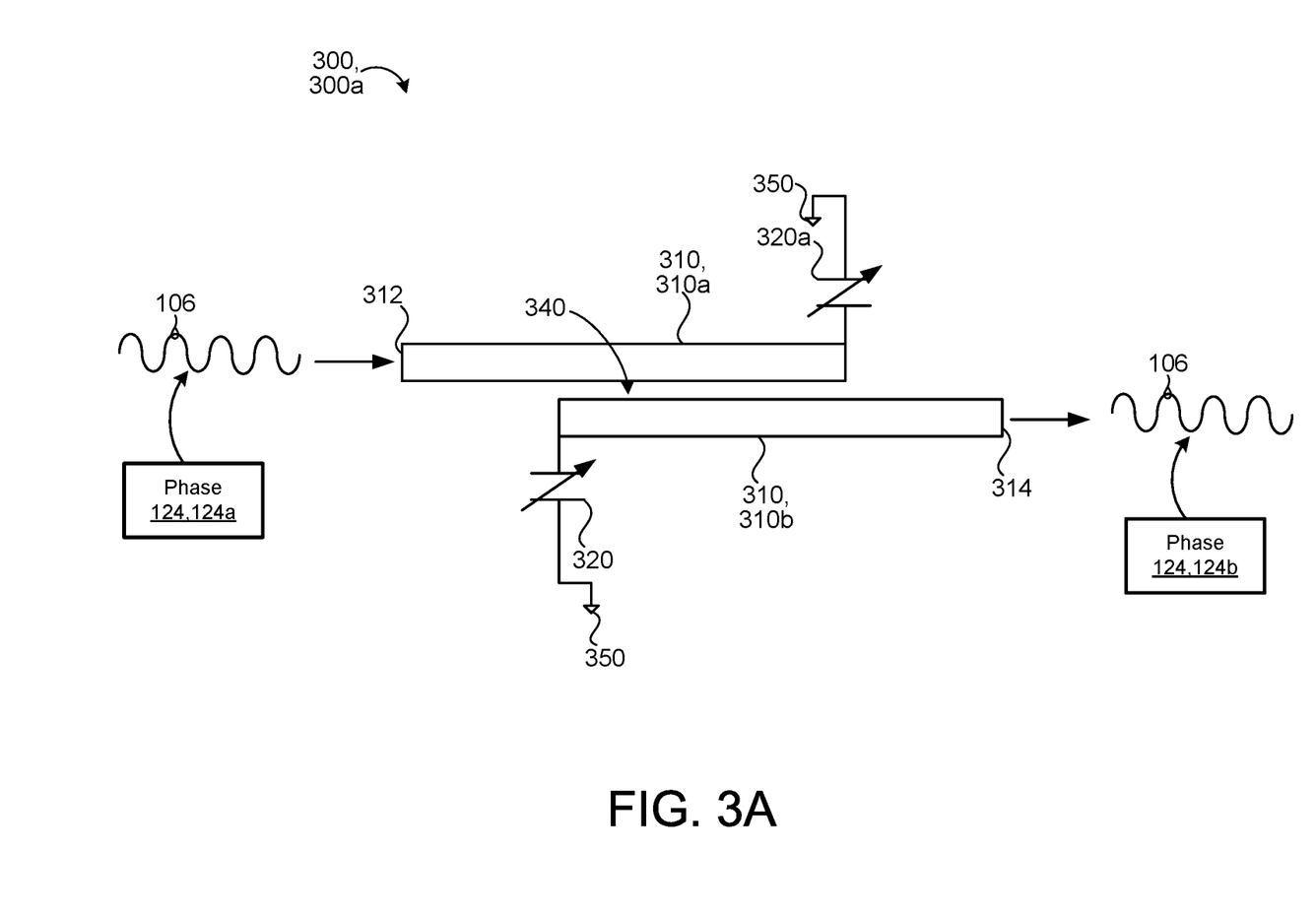
FIG. 3A provides a schematic view of an example phase shifter.

FIG. 3A provides a schematic view of an example phase shifter 300, 300a. The phase shifter 300 includes two or more electrodes or more specifically coupled lines 310, 310a, 310b. An input port 312 is connected to the first coupled line 310a. The input port 312 allows a signal 106 or electromagnetic wave having a first phase 124a to enter the first coupled line 310a. The signal 106 or electromagnetic wave builds up a charge on the first coupled line 310a and passes over a substrate 340 to a second coupled line 310b. The charge on the second coupled line 310b exits the phase shifter 300 at the output port 314. The signal 106 exiting the output port 314 has a second phase 124b different from the first phase 124a. As the charge difference increases, the total stored energy on the coupled lines 310 increases. The first coupled line 310a is arranged substantially parallel to the second coupled line 310b. In some examples, the coupled lines 310 are arranged at slight incidences to each other to allow for a different total capacitance and response. A variable capacitor 320 is connected to each coupled line 310. The variable capacitor 320 may be a digital variable capacitor 320 allowing the phase 124 of the signal 106 to be shifted by a digital controller of some form. In some examples, the variable capacitor 320 is connected to ground 350, or is a shunt variable capacitor 320. The coupled lines 310 may include a variety of materials such that they are conductive to the signal 106 or electromagnetic wave being sent through the coupled line 310. The substrate 340 may include a variety of dielectric or non-conductive materials, including but not limited to air, fiberglass, PC board materials, liquids, etc.

As the signal 106 or electromagnetic wave enters the input port 312, a charge builds up on the first coupled line 310a in relation to the voltage of the signal 106 or electromagnetic wave. As the charge builds there, a responsive charge builds on the second coupled line 310b. The response time of the phase shifter 300 changes based on the total capacitance of the phase shifter 300. This change in response time results in a change of the phase 124 between the signal 106 present at the input port 312 and the signal 106 present at the output port 314. Explained another way, as the total capacitance of the phase shifter 300 increases, the time between the charge needed on the first coupled line 310a to transfer the charge to the second coupled line 310b results in a phase shift. Adjustment of the variable capacitors 320 allows adjustment of the phase 124 of the signal 106 presented to the phase shifter 300. This phase shifter 300 allows for a very low insertion loss.

Figure 3B:
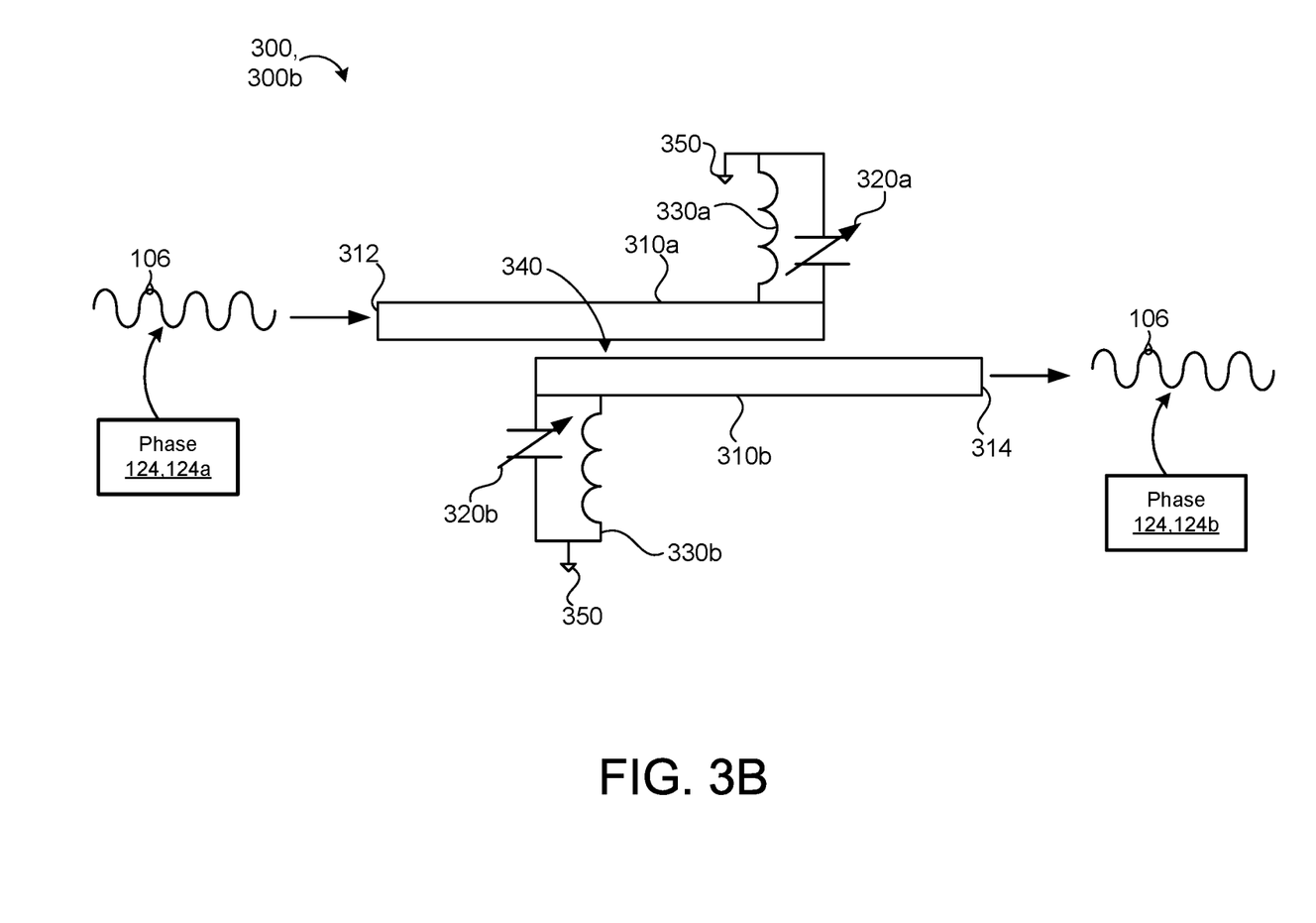
FIG. 3B provides a schematic view of an example phase shifter with a variable capacitor and an inductor.

FIG. 3B provides a schematic view of an example phase shifter 300, 300b with a variable capacitor 320 and an inductor 330. In some examples, it is advantageous to connect both an inductor 330 and a variable capacitor 320 to each coupled line 310. The inductor 330 and variable capacitor 320 may be connected in parallel and to ground 350. The combination of the inductor 330 and variable capacitor 320 increase the dynamic range and allow for a full 360 degree shift of the phase 124 of the signal 106. In some examples, the combination of the inductor 330 and variable capacitor 320 allow the dynamic range to be increased without increasing the total capacity reducing total insertion losses. The inductor 330 and variable capacitor 320 may form an LC circuit allowing the phase shifter 300 to operate at a given frequency or to phase shift part of a more complex signal 106. An LC circuit, also known as a resonant circuit, tank circuit, or tuned circuit, is an electrical circuit that includes an inductor (L) and a capacitor (C) connected together. The LC circuit acts as an electrical resonator, an electrical analogue of a tuning fork, storing energy that oscillates at the circuit's resonant frequency. In some examples, the inductor 330 and variable capacitor 320 form a tuned LC circuit resonate at a particular frequency band allowing the phase shifter 300 to have a greater dynamic range and with a lower total capacitance. In some examples, the inductor 330 and variable capacitor 320 LC circuit act as a filter to limit loss in the phase shifter 300. The inductor 330 and variable capacitor 320 may be shunt inductors 330 and variable capacitors 320.

Figure 3C:
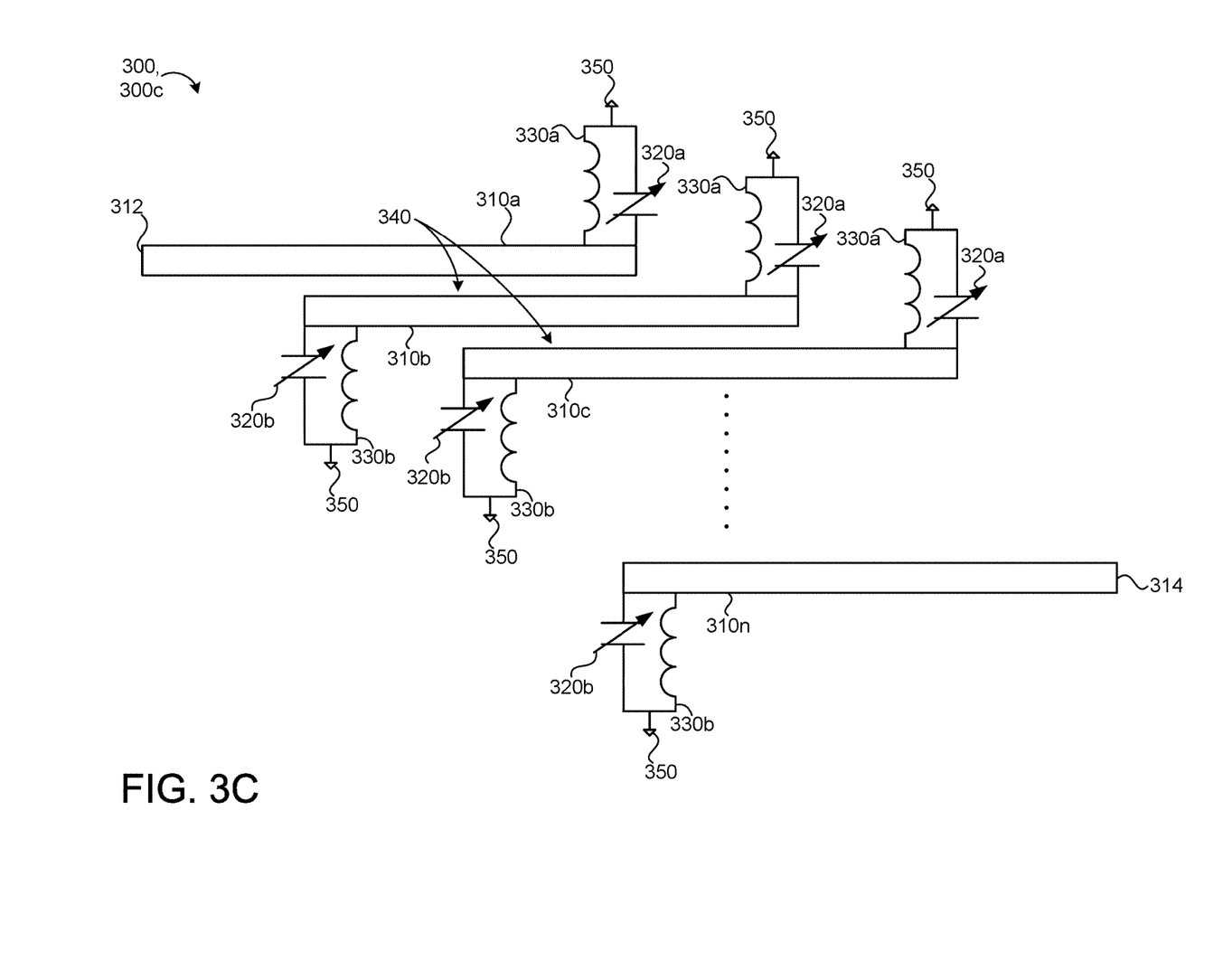
FIG. 3C provides a schematic view of an example phase shifter with multiple broad-line couplers, variable capacitors, and inductors.

FIG. 3C provides a schematic view of an example phase shifter 300, 300c with multiple coupled lines 310, variable capacitors 320 and inductors 330. The greater the capacitance of the individual variable capacitors 320, the lower the resolution of the shift in the phase 124. In order to increase the resolution of the phase 124 shift provided by the phase shifter 300, multiple coupled lines 310 may be added with each coupled line 310, 310a-n, where each coupled line 310 has its own respective variable capacitor 320 and inductor 330. The plurality of variable capacitors 320 allows each individual variable capacitor 320 to remain small, providing good resolution while still allowing sufficient total capacitance to provide 360 degrees of phase 124 shift. A first coupled line 310a is connected to the input port 312. A last coupled line 310n is connected to the output port 314. Separating each coupled line 310, 310a-n is a substrate 340. This allows the combination of the coupled lines 310, 310a-n to act as a single phase shifter 300. The first coupled line 310a is connected to a first variable capacitor 320a and a first inductor 330a. The first variable capacitor 320a and the first inductor 330a may be connected in parallel to ground 350. The last coupled line 310n is connected to a last variable capacitor 320n and a last inductor 330n. The last variable capacitor 320a and the last inductor 330a may be connected in parallel to ground 350. Any one of the coupled lines 310b-(n–1) between the first coupled line 310a and the last coupled line 310n includes first and second pairs of a variable capacitor 320 and an inductor 330. The variable capacitor 320a and the inductor 330a may be connected in parallel to ground 350. In some implementations, the coupled lines 310 are built horizontally across a single PC board, or may be built vertically with each coupled line 310 being contained on a different layer of the PC board. This may assist in manufacturing by allowing the small gaps required between the coupled lines 310 to be more easily created.

With continued reference to FIGS. 3A-3C, in some implementations, a first coupled line 310 and a second coupled line 310 are edge-side coupled (side-by-side) or broadside coupled (over and under). Coupling occurs between two coupled lines when their electromagnetic fields are not independent due to their proximity. In some examples, edge-side coupling uses two non-shielded wires next to each other, which results in a simple structure and has a low coupling coefficient and bandwidth. These geometries are commonly fabricated with a microstrip and coplanar waveguide. Although a coplanar waveguide takes more time to fabricate, it yields a higher isolation than a microstrip. Broad-side coupling may be fabricated with both a coplanar waveguide and microstrip, and often includes a substrate with an upper and lower ground. Broad-side couplers may achieve a high coupling coefficient (e.g., 3 dB) but may have a very narrow bandwidth.

In one example, with three coupled lines 310, 310a-c for a phase shifter 300 tuned to operate at 2.6 GHz and each variable capacitor 320 has a dynamic range capacitance of 0.5 pF to 3.5 pF, the resolution of the phase shifter 300 would approximately be 1-5 degrees, which occurs after 180-degree phase change. For lower capacitor values, the phase change is one degree; however, as the capacitor value increases, the phase shift would reach 3-4 degrees. Furthermore, the phase shift improves by adding more coupled lines as shown in FIG. 3C. In some examples, each coupled line 310 adds two degrees of freedom, because each coupled line 310 includes two LC circuits. The phase shifter 300 can achieve a lower phase dynamic range up to 90 degrees by using a lower number of coupled lines 310 or decreasing the value of the dynamic capacitors 320. In contrast, if the phase shifter 300 has to provide high dynamic range phase shifting with higher resolution, then the number of capacitor is increased.

Figure 4:
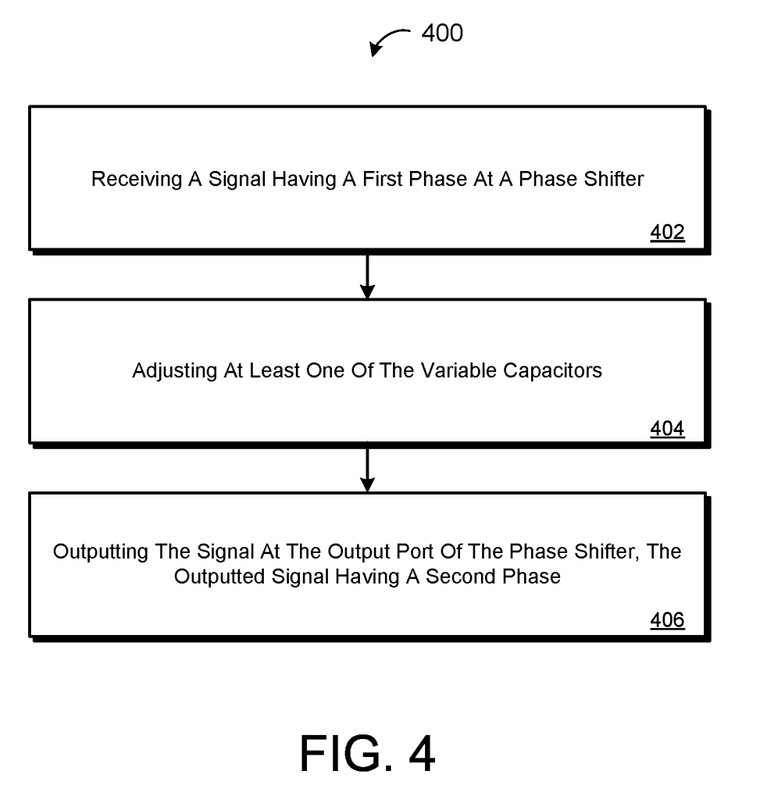
FIG. 4 is an example arrangement of operations for operating a phase shifter having a broad-line coupler with low loss and high resolution.

FIG. 4 illustrates an example arrangement of operations for a method 400 of operating the low loss and high resolution phase shifter 300 having coupled lines 310 described in FIGS. 3A-3C. At block 402, the method 400 includes receiving a signal 106 having a first phase 124a at a phase shifter 300. At block 404, the method 400 includes adjusting at least one of the variable capacitors 320, and at block 406, outputting the signal 106 at the output port 314 of the phase shifter 300. The outputted signal 106 has a second phase 124b different than the first phase 124a. The phase shifter 300 includes an input port 312 configured to receive the signal 106, a first coupling line 310a connected to the input port 312, an output port 314, and a second coupling line 310b-n connected to the output port 314 and arranged substantially parallel to the first coupling line 310a. The phase shifter 300 also includes a substrate 340 disposed between the first coupling line 310a and the second coupling line 310b-n, a first variable capacitor 320a disposed on the first coupling line, and a second variable capacitor 320b disposed on the second coupling line. Adjustment of one or more of the variable capacitors 320 causes a phase shift between the input port 312 and the output port 314. In other words, a signal having a first phase 124a at the input port 312 and a second phase 124b at the output port 314.

The phase shifter 300 may include a first inductor 330a disposed on the first coupling line 310a in parallel with the first variable capacitor 320a and a second inductor 330b disposed on the second coupling line 310b-n in parallel with the second variable capacitor 320b. Each variable capacitor 320 may be shunt with the corresponding inductor 330 on the respective coupling line 310. In some examples, the method 400 includes independently adjusting the variable capacitors 330. The first coupling line 310a and the second coupling 330b-n line may be edge coupled or broadside coupled.

In some examples, the phase shifter 300 includes a third coupling line 310 connected to the first coupling line 310a and arranged substantially parallel to the first coupling line 310a and the second coupling line 310b-n and a third variable capacitor 320 disposed on the third coupling line 310. The phase shifter 300 may also include a third inductor 330 disposed on the third coupling line 310 in parallel with the third variable capacitor 320, wherein the third variable capacitor 320 is shunt with the third inductor 330 on the respective coupling line 310. In addition, the phase shifter 300 may include a fourth variable capacitor 320 disposed on the third coupling line 310 and a fourth inductor 330 disposed on the third coupling line 310 in parallel with the fourth variable capacitor 320, wherein the fourth variable capacitor 320 is shunt with the fourth inductor 330 on the respective coupling line 310. The first variable capacitor 320a, the second variable capacitor 320b, the third variable capacitor 320, and fourth variable capacitor 320 may be configured to provide a high resolution phase change. The method 400 may also include outputting the signal 106 from the output port 314 of the phase shifter 300 to an antenna 100.

A number of implementations have been described. Nevertheless, it will be understood that various modifications may be made without departing from the spirit and scope of the disclosure. Accordingly, other implementations are within the scope of the following claims.

What is claimed is:
1. A phase shifter comprising:
an input port;
a first coupling line connected to the input port;
an output port;
a second coupling line connected to the output port and arranged substantially parallel to the first coupling line;
a substrate disposed between the first coupling line and the second coupling line;
a first variable capacitor disposed on the first coupling line; and
a second variable capacitor disposed on the second coupling line,
wherein adjustment of one or more of the variable capacitors causes a phase shift between the input port and the output port.
2. The phase shifter of claim 1, further comprising:
a first inductor disposed on the first coupling line in parallel with the first variable capacitor; and
a second inductor disposed on the second coupling line in parallel with the second variable capacitor.
3. The phase shifter of claim 2, wherein each variable capacitor is shunt with the corresponding inductor on the respective coupling line.
4. The phase shifter of claim 1, wherein each variable capacitor is independently adjustable in response to a change in a signal entering the input port.
5. The phase shifter of claim 1, wherein the first coupling line and the second coupling line are edge coupled or broadside coupled.
6. The phase shifter of claim 1, further comprising:
a third coupling line connected to the second coupling line and arranged substantially parallel to the first coupling line and the second coupling line; and
a third variable capacitor disposed on the third coupling line.
7. The phase shifter of claim 6, further comprising a third inductor disposed on the third coupling line in parallel with the third variable capacitor, the third variable capacitor is shunt with the third inductor on the respective coupling line.
8. A system comprising:
an antenna configured to emit a signal; and
a phase shifter connected to the antenna, the phase shifter comprising:
an input port configured to receive the signal;
a first coupling line connected to the input port;
an output port in communication with the antenna;
a second coupling line connected to the output port and arranged substantially parallel to the first coupling line;
a substrate disposed between the first coupling line and the second coupling line;
a first variable capacitor disposed on the first coupling line; and
a second variable capacitor disposed on the second coupling line,
wherein adjustment of one or more of the variable capacitors causes a phase shift between the input port and the output port.
9. The system of claim 8, further comprising a transceiver connected to the antenna and configured to transmit or receive the signal, wherein the transceiver comprises the phase shifter.
10. The system of claim 8, wherein the phase shifter further comprises:
a first inductor disposed on the first coupling line in parallel with the first variable capacitor; and
a second inductor disposed on the second coupling line in parallel with the second variable capacitor.
11. The system of claim 10, wherein each variable capacitor is shunt with the corresponding inductor on the respective coupling line.
12. The system of claim 8, wherein each variable capacitor is independently adjustable in response to a change in the signal entering the input port.
13. The system of claim 8, wherein the first coupling line and the second coupling line are edge coupled or broadside coupled.
14. The system of claim 8, wherein the phase shifter further comprises:
a third coupling line connected to the first coupling line and arranged substantially parallel to the first coupling line and the second coupling line; and
a third variable capacitor disposed on the third coupling line.

15. The system of claim 14, wherein the phase shifter further comprises a third inductor disposed on the third coupling line in parallel with the third variable capacitor, wherein third variable capacitor is shunt with the third inductor on the respective coupling line.

16. The system of claim 8, wherein the adjustment of one or more of the variable capacitors causes the phase shift to be approximately between zero and 360 degrees between the input port and the output port.

17. A method comprising:
receiving a signal having a first phase at a phase shifter, the phase shifter comprising:
an input port configured to receive the signal;
a first coupling line connected to the input port;
an output port;
a second coupling line connected to the output port and arranged substantially parallel to the first coupling line;
a substrate disposed between the first coupling line and the second coupling line;
a first variable capacitor disposed on the first coupling line; and
a second variable capacitor disposed on the second coupling line,
wherein adjustment of one or more of the variable capacitors causes a phase shift between the input port and the output port;
adjusting at least one of the variable capacitors; and
outputting the signal at the output port of the phase shifter, the outputted signal having a second phase.

18. The method of claim 17, wherein the phase shifter further comprises:
a first inductor disposed on the first coupling line in parallel with the first variable capacitor; and
a second inductor disposed on the second coupling line in parallel with the second variable capacitor.

19. The method of claim 18, wherein each variable capacitor is shunt with the corresponding inductor on the respective coupling line.

20. The method of claim 17, further comprising independently adjusting the variable capacitors.

21. The method of claim 17, wherein the first coupling line and the second coupling line are edge coupled or broadside coupled.

22. The method of claim 17, wherein the phase shifter further comprises:
a third coupling line connected to the first coupling line and arranged substantially parallel to the first coupling line and the second coupling line; and
a third variable capacitor disposed on the third coupling line.

23. The method of claim 22, wherein the phase shifter further comprises a third inductor disposed on the third coupling line in parallel with the third variable capacitor, wherein the third variable capacitor is shunt with the third inductor on the respective coupling line.

24. The method of claim 22, wherein the first variable capacitor, the second variable capacitor, and the third variable capacitor are configured to provide a high resolution phase change.

25. The method of claim 17, further comprising outputting the signal from the output port of the phase shifter to an antenna.

* * * * *